(12) United States Patent
Han et al.

(10) Patent No.: US 9,356,078 B2
(45) Date of Patent: May 31, 2016

(54) HIGH APERTURE RATIO ORGANIC LIGHT EMITTING DIODE DISPLAY HAVING DOUBLE BANK STRUCTURE

(71) Applicant: LG Display Co., Ltd., Seoul (KR)

(72) Inventors: Jeonphill Han, Seoul (KR); Heumeil Baek, Gyeonggi-do (KR); Sangpyo Hong, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/459,502

(22) Filed: Aug. 14, 2014

(65) Prior Publication Data

US 2015/0060810 A1 Mar. 5, 2015

(30) Foreign Application Priority Data

Aug. 30, 2013 (KR) .................. 10-2013-0104385

(51) Int. Cl.
*H01L 29/08* (2006.01)
*H01L 27/32* (2006.01)
*H01L 51/00* (2006.01)

(52) U.S. Cl.
CPC .......... *H01L 27/3246* (2013.01); *H01L 27/322* (2013.01); *H01L 51/0005* (2013.01)

(58) Field of Classification Search
CPC .............. H01L 51/5203; H01L 51/525; H01L 51/0005; H01L 27/3216; H01L 27/3218; H01L 27/3246; H01L 27/322

USPC ....................................................... 257/40, 89
See application file for complete search history.

(56) References Cited

U.S. PATENT DOCUMENTS

| | | | | |
|---|---|---|---|---|
| 2010/0045173 | A1* | 2/2010 | Kwon ................. | H01L 27/3246 313/504 |
| 2012/0175605 | A1* | 7/2012 | Shin .................... | H01L 27/3265 257/43 |
| 2014/0027729 | A1* | 1/2014 | So ....................... | H01L 51/5056 257/40 |
| 2014/0252321 | A1* | 9/2014 | Pyon ................... | H01L 27/3216 257/40 |
| 2014/0284563 | A1* | 9/2014 | Baek ................... | H01L 51/5203 257/40 |

* cited by examiner

*Primary Examiner* — Vongsavanh Sengdara
(74) *Attorney, Agent, or Firm* — Morgan, Lewis & Bockius LLP

(57) ABSTRACT

The present disclosure relates to an organic light emitting diode display having high aperture ratio. The present disclosure suggests an organic light emitting diode display comprising: a substrate having a plurality of pixel area arrayed in a matrix manner; an anode electrode formed within the pixel area on the substrate; a first bank having an open area exposing most of the anode electrode and defining an emission area; a second bank exposing the open area exposed by the first bank and some upper surface of the first bank; an organic light emitting layer covering the some upper surface of the first bank by the second bank and the most of anode electrode exposed by the first bank; and a cathode electrode formed over the substrate having the organic light emitting layer.

6 Claims, 9 Drawing Sheets

HIGH APERTURE RATIO ORGANIC LIGHT EMITTING DIODE DISPLAY HAVING DOUBLE BANK STRUCTURE

This application claims the benefit of Korea Patent Application No. 10-2013-104385 filed on Aug. 30, 2013, which is incorporated herein by reference for all purposes as if fully set forth herein.

BACKGROUND OF THE INVENTION

1. Field of the Invention

The present disclosure relates to an organic light emitting diode display having high aperture ratio, and more particularly to a high aperture ratio organic light emitting diode display having a double bank structure to prevent from forming non-filling areas when depositing an organic light emitting material using an ink filling method.

2. Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

The electroluminescence display device is categorized in the inorganic light emitting diode display device and the organic light emitting diode display device according to the luminescence material. As a self-emitting display device, the electroluminescence display device has the merits those the response speed is very fast, the brightness is very high and the view angle is large.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the excition formed at the excitation state in which the hole and the electron are recombined at the emission layer EML.

The organic light emitting diode radiates the lights due to the energy from the excition formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLED) using the organic light emitting diode can be categorized in the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT).

FIG. 2 is the exemplary circuit diagram illustrating the structure of one pixel in the active matrix organic light emitting diode display (or AMOLED). FIG. 3 is a plane view illustrating the structure of one pixel in the AMOLED. FIG. 4 is a cross sectional view along the cutting line I-I' for illustrating the structure of the AMOLED.

With reference to FIGS. 2 and 3, the active matrix organic light emitting diode display comprises a switching thin film transistor ST, a driving thin film transistor DT connected to the switching thin film transistor ST, and an organic light emitting diode OLED connected to the driving thin film transistor DT.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD.

The driving thin film transistor DT acts for driving an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED.

With reference to FIG. 4 more detail, on the substrate SUB of the active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed.

The drain electrode SD of the switching thin film transistor ST is connected to the gate electrode DG of the driving thin film transistor DT via the gate contact hole GH penetrating the gate insulator GI. The passivation layer PAS is deposited on the substrate SUB having the switching thin film transistor ST and the driving thin film transistor DT. On the passivation layer PAS, an anode electrode ANO of the organic light emitting diode OLED is formed. Here, the anode electrode ANO is connected to the drain electrode DD of the driving thin film transistor DT via the pixel contact hole PH formed at the passivation layer PAS.

On the substrate SUB having the anode electrode ANO, a bank (or 'bank pattern') BN is formed over the area having the switching thin film transistor ST, the driving thin film transistor DT and the various lines DL, SL and VDD, for defining the light emitting area.

The top surface of the substrate SUB having the thin film transistors ST and DT, and the various lines DL, SL and VDD is not even or smoothing condition but has many stepped profiles. When the organic material, such as an organic light emitting layer, is deposited on the surface having uneven or un-smoothing surface condition, the characteristics of the organic material may be deteriorated. The bank BN is for preventing the organic material from being deteriorated at the stepped portion. To divide the emitting area having the even surface from the non-emitting area having the switching thin film transistor ST, the driving thin film transistors DT, and the various lines DL, SL and VDD, the bank BN is formed over the non-emitting area. Therefore, by the bank BN, the emitting area is defined.

The exposed portion of the anode electrode ANO by the bank BN would be the light emitting area. On the anode electrode ANO exposed from the bank BN, the organic light emitting layer OLE is formed. On the organic light emitting layer OLE, the cathode electrode CAT is formed. Here, the organic light emitting layer may be a color organic light emitting layer COLE which can emit any one color allocated at each pixel.

We will explain about the emitting area defined by the bank BN at the pixel area defined by the data line DL, the scan line SL and the driving current line VDD. The anode electrode ANO is formed as not overlapping with the data line DL, the scan line SL and the driving current line VDD.

As the organic light emitting diode display is driven by the current driving method, the anode electrode ANO may be supplied with a big current through the driving current line VDD. If the anode electrode ANO is overlapped with any line DL, SL and/or VDD, the parasitic capacitance may be formed at the passivation layer PAS inserted there-between. In the related art, the passivation layer PAS has about 3,000 Å thickness. In the liquid crystal display driven by the voltage driving method, the passivation layer of 3,000 Å thickness can prevent forming of the parasitic capacitance between the pixel electrode and any line DL and/or SL.

Further, when the passivation layer PAS includes an organic material having lower permeability, even if the pixel electrode of the liquid crystal display is overlapped with lines around the pixel electrode, there is no parasitic capacitance at the overlapped portion. Therefore, the aperture ratio can be easily ensured. However, in the case of the organic light emitting diode display having the passivation layer of 3,000 Å thickness, as the current supplied to the anode electrode ANO is very large or big, the parasitic capacitance can be formed easily between the overlapping portions when the anode electrode ANO is formed as being overlapped with any line. This may be resulted the deteriorated quality of the video data in the organic light emitting diode display.

In the related art, when the anode electrode ANO is designed, it should be apart from the current driving line VDD with a predetermined distance by considering the alignment margin in the patterning process, as shown in FIGS. 3 and 4. Also, when forming the bank BN over the anode electrode ANO, by considering the pattern processing margin, the edge of the bank BN should be located inside from the edge of the anode electrode ANO. That is, the open area defined by the bank BN would be smaller than the area of the anode electrode ANO as the rectangular shape drawn by the 'alternated long and short dash line' shown in FIG. 3. The open area would be designed as the emitting area.

On the surface of the substrate SUB having the bank BN, the organic light emitting layer OLE is deposited as covering the anode electrode ANO. On the organic light emitting layer OLE, a cathode electrode CAT is deposited. As a result, the area where the anode electrode ANO, the organic light emitting layer OLE and the cathode electrode CAT are overlapped at the same time would be the emitting area.

With reference to FIG. 5, we will explain about the relationship between the pixel area and the emitting area according to the related art. FIG. 5 is a plane view illustrating the lowered aperture ratio by that the organic light emitting material is not filling to the corner area of the emitting area defined by the bank, in the AMOLED according to the related art.

There are some methods for depositing the organic light emitting layer OLE including the vacuum heating depositing method or the ink-jet printing method. As explained above, when the organic light emitting layer OLE is deposited over the bank BN having rectangular shape, the organic light emitting material may not be filled at the corner portions. This area in which the organic light emitting layer OLE is not deposited is called as the Non-fill Area.

As a result, the actual emitting area is defined as the oval shape represented in the dotted line as shown in FIG. 5. That is, the emitting area is much smaller than the anode electrode ANO, especially, it is much smaller than the anode electrode ANO exposed by the bank BN. According to the related art, the aperture ratio, the ratio of the emitting area to the exposed area of the anode electrode would be lowered.

SUMMARY OF THE INVENTION

Accordingly, the present invention is directed to a high aperture ratio organic light emitting diode display having double bank structure that substantially obviates one or more of the problems due to limitations and disadvantages of the related art.

An object of the present invention is to provide an organic light emitting diode display having higher aperture ratio by reducing the loss of the emitting area. Another object of the present invention is to provide a high aperture ratio organic light emitting diode display having a double bank structure for preventing the non-fill area of the organic light emitting layer from existing within the bank pattern.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described an organic light emitting diode display comprises: a substrate having a plurality of pixel area arrayed in a matrix manner; an anode electrode formed within the pixel area on the substrate; a first bank having an open area exposing most of the anode electrode and defining an emission area; a second bank exposing the open area exposed by the first bank and some upper surface of the first bank; an organic light emitting layer covering the some upper surface of the first bank by the second bank and the most of anode electrode exposed by the first bank; and a cathode electrode formed over the substrate having the organic light emitting layer.

In one embodiment, the present disclosure suggests an organic light emitting diode display further comprises a thin film transistor disposed within the pixel area and connected to the anode electrode.

In one embodiment, the present disclosure suggests an organic light emitting diode display further comprises a color filter disposed under the anode electrode and representing any one of red, green and blue allocated in each pixel, wherein the organic light emitting layer includes an organic material emitting a white light.

In one embodiment, the organic light emitting layer includes an organic material emitting any one of red, green and blue color lights allocated at each pixel area.

In one embodiment, the second bank exposes a plurality of anode electrodes exposed by the first bank.

In one embodiment, the second bank exposes a plurality of anode electrodes formed at neighboring pixel areas allocated with the same color lights.

In one embodiment, the second bank includes: a first group open area exposing all of the anode electrodes formed neighboring red pixel areas each other; a second group open area exposing all of the anode electrodes formed neighboring green pixel areas each other; and a third group open area exposing all of the anode electrodes formed neighboring blue pixel areas each other.

The organic light emitting diode display according to present disclosure has the first bank defining the emitting area and the second bank defining a larger opening area than the first bank so that the organic light emitting layer can be deposited on the first and the second bank without any non-fill area. Therefore, the organic light emitting diode display according to the present disclosure the exposed area of the anode electrode by the first bank for defining the emitting area would be defined as the emitting area without any loss. As the result, the reduction of aperture ratio due to the non-fill area can be eliminated and the much higher aperture ratio organic light emitting diode display can be easily suggested.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
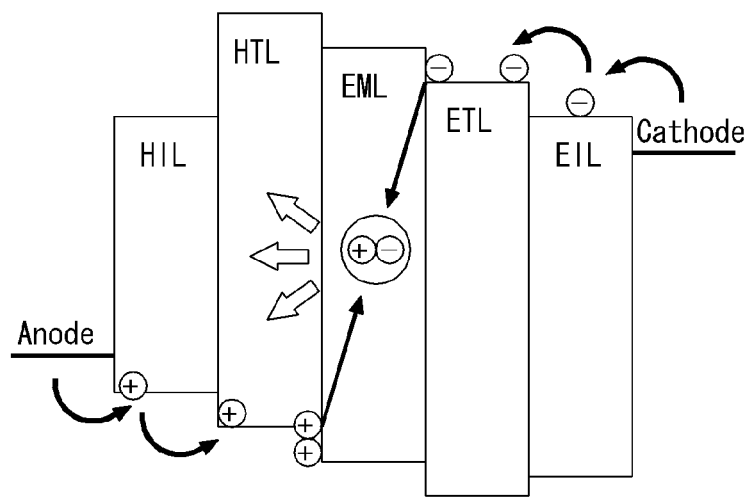
FIG. 1 is a diagram illustrating the structure of the organic light emitting diode according to the related art.
Figure 2:
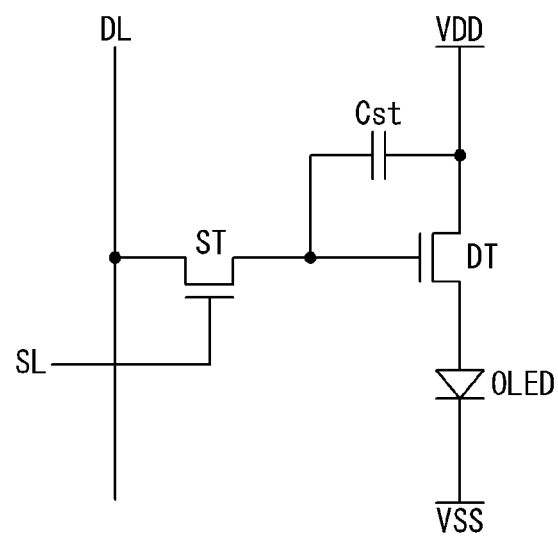
FIG. 2 is the exemplary circuit diagram illustrating the structure of one pixel in the active matrix organic light emitting diode display (or AMOLED) according to the related art.
Figure 3:
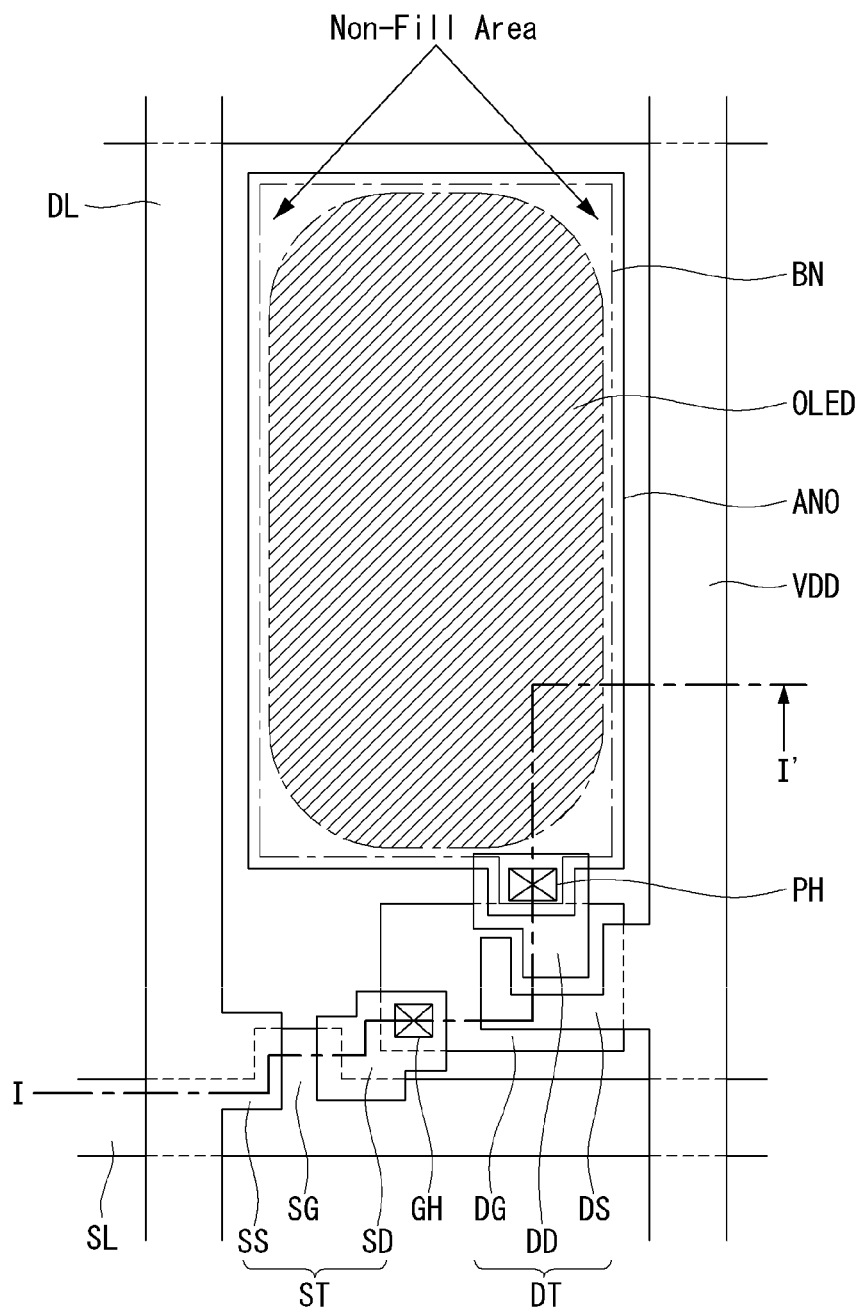
FIG. 3 is a plane view illustrating the structure of one pixel in the AMOLED according to the related art.
Figure 4:
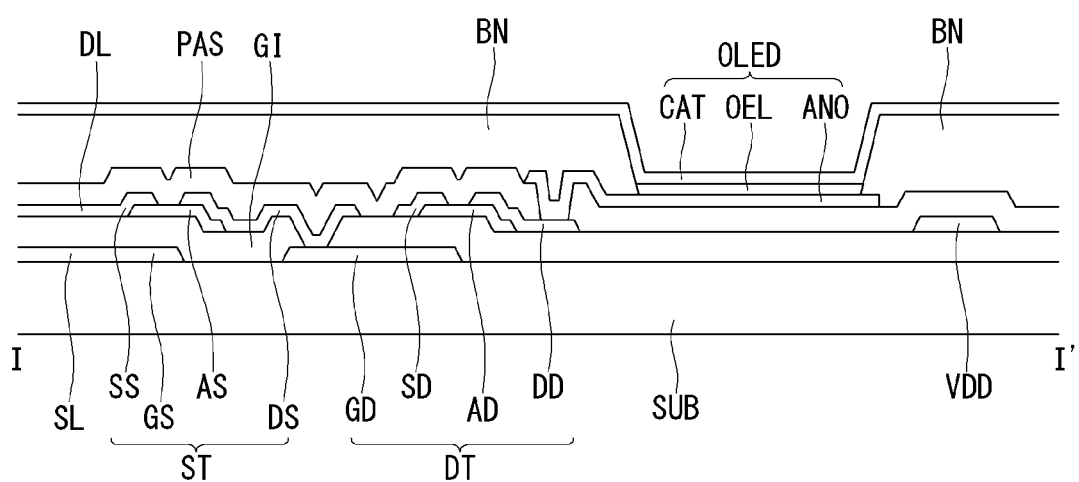
FIG. 4 is a cross sectional view along the line I-I' for illustrating the structure of the AMOLED according to the related art.
Figure 5:
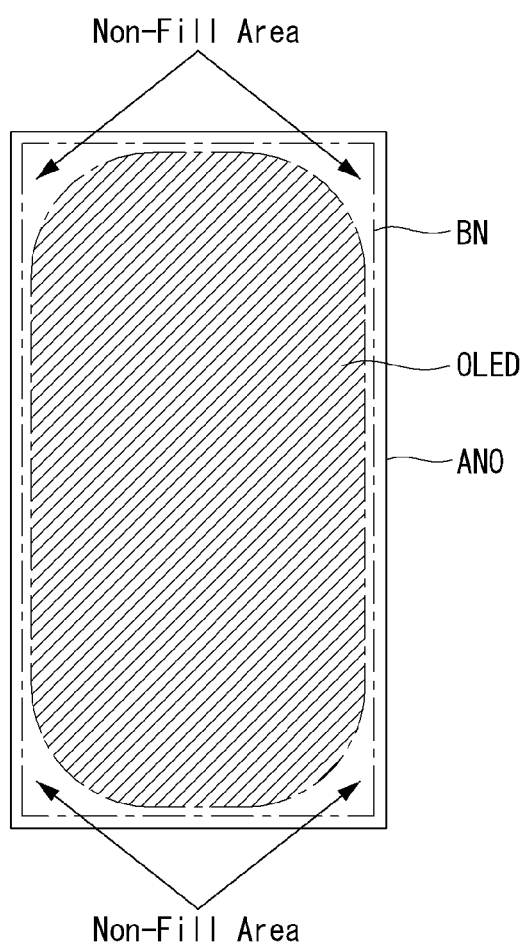
FIG. 5 is a plane view illustrating the lowered aperture ratio by that the organic light emitting material is not filling to the corner area of the emitting area defined by the bank, in the AMOLED according to the related art.

With reference to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 6:
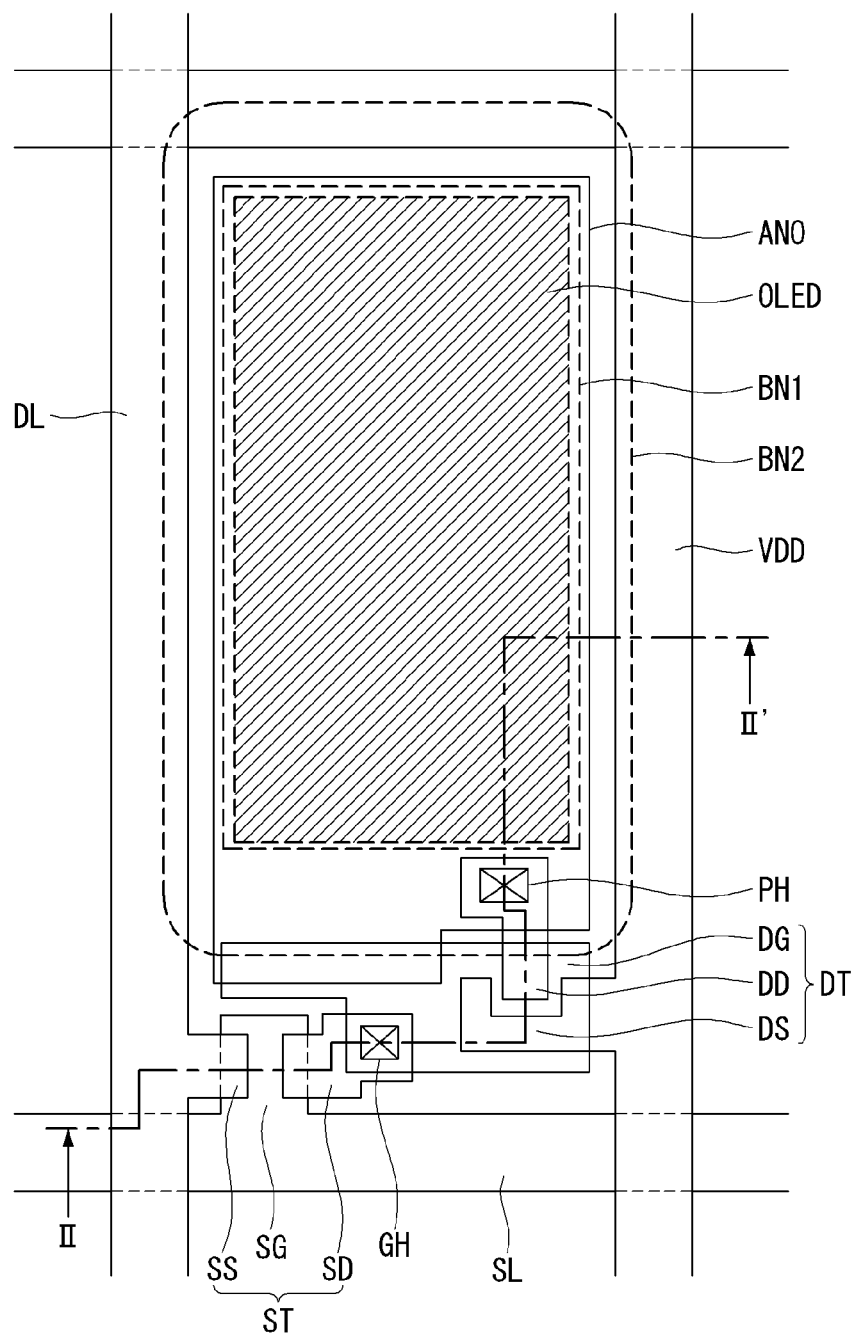
FIG. 6 is a plane view illustrating an organic light emitting diode display having a double bank structure according to a first example embodiment of the present disclosure.
Figure 7:
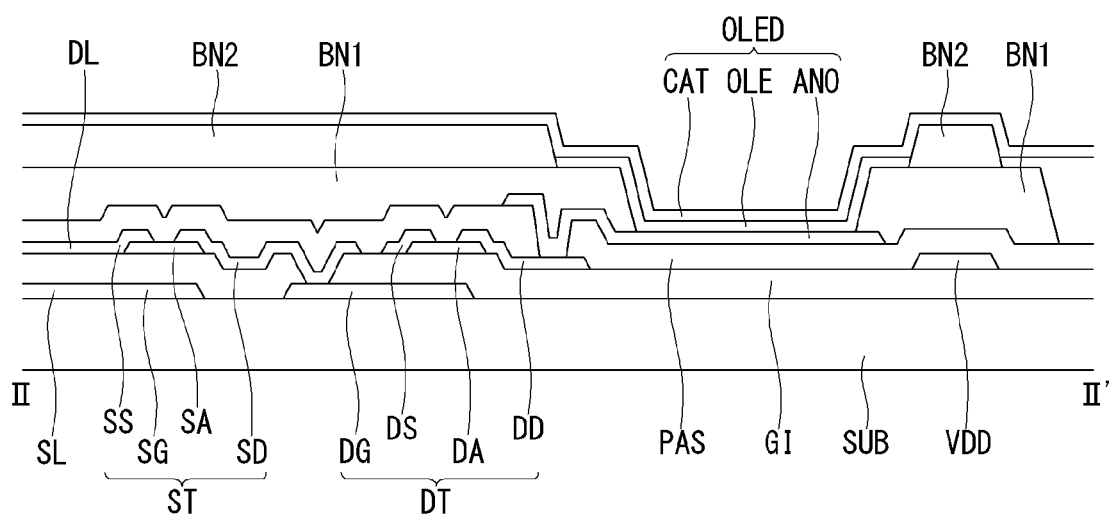
FIG. 7 is a cross sectional view along line of II-II' in FIG. 6 for illustrating the structure of an organic light emitting diode display according to the first embodiment of the present disclosure.

Hereinafter, with reference to FIGS. 6 and 7, we will explain about an organic light emitting diode display according to the first embodiment of the present disclosure. FIG. 6 is a plane view illustrating an organic light emitting diode display having a double bank structure according to the first embodiment of the present disclosure. FIG. 7 is a cross sectional view along the cutting line of II-II' in FIG. 6 for illustrating the structure of an organic light emitting diode display according to the first embodiment of the present disclosure.

With reference to FIGS. 6 and 7, an organic light emitting diode display according to the first embodiment of the present disclosure has a switching thin film transistor ST, a driving thin film transistor DT connected to the switching thin film transistor ST, and an organic light emitting diode OLED connected to the driving thin film transistor DT.

The switching thin film transistor ST is formed where the scan line SL and the data line DL is crossing. The switching thin film transistor ST can select any specific pixel. The switching thin film transistor ST includes a gate electrode SG branching from the scan line SL, an active layer SA, a source electrode SS and a drain electrode SD.

The driving thin film transistor DT can drive the organic light emitting diode OLED of a pixel selected by the switching thin film transistor ST. The driving thin film transistor DT includes a gate electrode DG connected to the drain electrode SD of the switching thin film transistor ST, an active layer DA, a source electrode DS connected to the driving current line VDD, and a drain electrode DD. The drain electrode DD of the driving thin film transistor DT is connected to the anode electrode ANO of the organic light emitting diode OLED.

On the substrate SUB of the active matrix organic light emitting diode display, the gate electrodes SG and DG of the switching thin film transistor ST and the driving thin film transistor DT, respectively, formed on a substrate SUB. On the gate electrodes SG and DG, the gate insulator GI is deposited. The semiconductor layers SA and DA are formed on some portions of the gate insulator GI overlapping with the gate electrodes SG and DG. On the semiconductor layers SA and DA, the source electrodes SS and DS and the drain electrodes SD and DD are facing each other respectively with certain distance. The drain electrode SD of the switching thin film transistor ST is connected to the gate electrode DG of the driving thin film transistor DT via the contact hole penetrating the gate insulator GI.

The passivation layer PAS is deposited on the substrate SUB having the switching thin film transistor ST and the driving thin film transistor DT. On the passivation layer PAS, the anode electrode ANO of the organic light emitting diode OLED connected to the driving thin film transistor DT is formed. Here, the anode electrode ANO is connected to the drain electrode DD of the driving thin film transistor DT through the pixel contact hole PH formed at the passivation layer PAS.

To define an emitting area on the substrate SUB having the anode electrode ANO, a first bank BN1 is formed for dividing a non-emitting area having the switching thin film transistor ST, the driving thin film transistor DT and the various lines DL, SL and VDD from the emitting area having the organic light emitting diode OLED. On the first bank BN1, a second bank BN2 is formed.

The first bank BN1 includes an open area defining an actual emitting area. The second bank BN2 covers some portions of the upper surface of the first bank BN1, and has an open area having a larger area than that of the open area by the first bank BN1. That is, there is a step profile between the first bank BN1 and the second bank BN2.

By the first bank BN1 and the second bank BN2, most portions of the anode electrode ANO are exposed. On the anode electrode ANO exposed from the first bank BN1 and the second bank BN2, an organic light emitting layer OLE and a cathode electrode CAT are sequentially deposited. Therefore, an organic light emitting diode OLED having the anode electrode ANO, the organic light emitting layer OLE and the cathode electrode, and connecting to the driving thin film transistor DT is completed.

The first embodiment of the present disclosure suggests a structure which can be applied to the top emission type organic light emitting diode display and the bottom emission type organic light emitting diode display. Therefore, the organic light emitting layer OLE may be formed as including an organic light emitting material radiating any one color light among red, green and blue, at each pixel. In detail, depositing the red organic light emitting material on the whole surface of the substrate SUB and patterning it, the red organic light emitting material is formed as being filled only at the open area defined by the second bank BN2 of the red pixel area. By the same method, the green organic light emitting material is formed as being filled only within the open area by the second bank BN2 of the green pixel area. Also, the blue organic light emitting material is formed as being filled only within the open area by the second bank BN2 of the blue pixel area.

As a result, the organic light emitting layer OLE is formed as filling and covering the upper surface of the first bank BN1 exposed by the second bank BN2, the side wall of the first bank BN1, and the surface of the anode electrode ANO exposed by the open area of the first bank BN1. Like this, as the organic light emitting layer OLE is deposited as covering the border area between the first bank BN and the second bank BN2 having the stepped profile, at least within the open area by the first bank BN1, the organic light emitting layer OLE is deposited without the 'non-fill area'. Therefore, according to the first embodiment of the present disclosure, the emitting area defined by the first bank BN1 can be formed without any loss of aperture ratio. In other words, the open area defined by the first bank BN1 is just defined as the emitting area.

Figure 8:
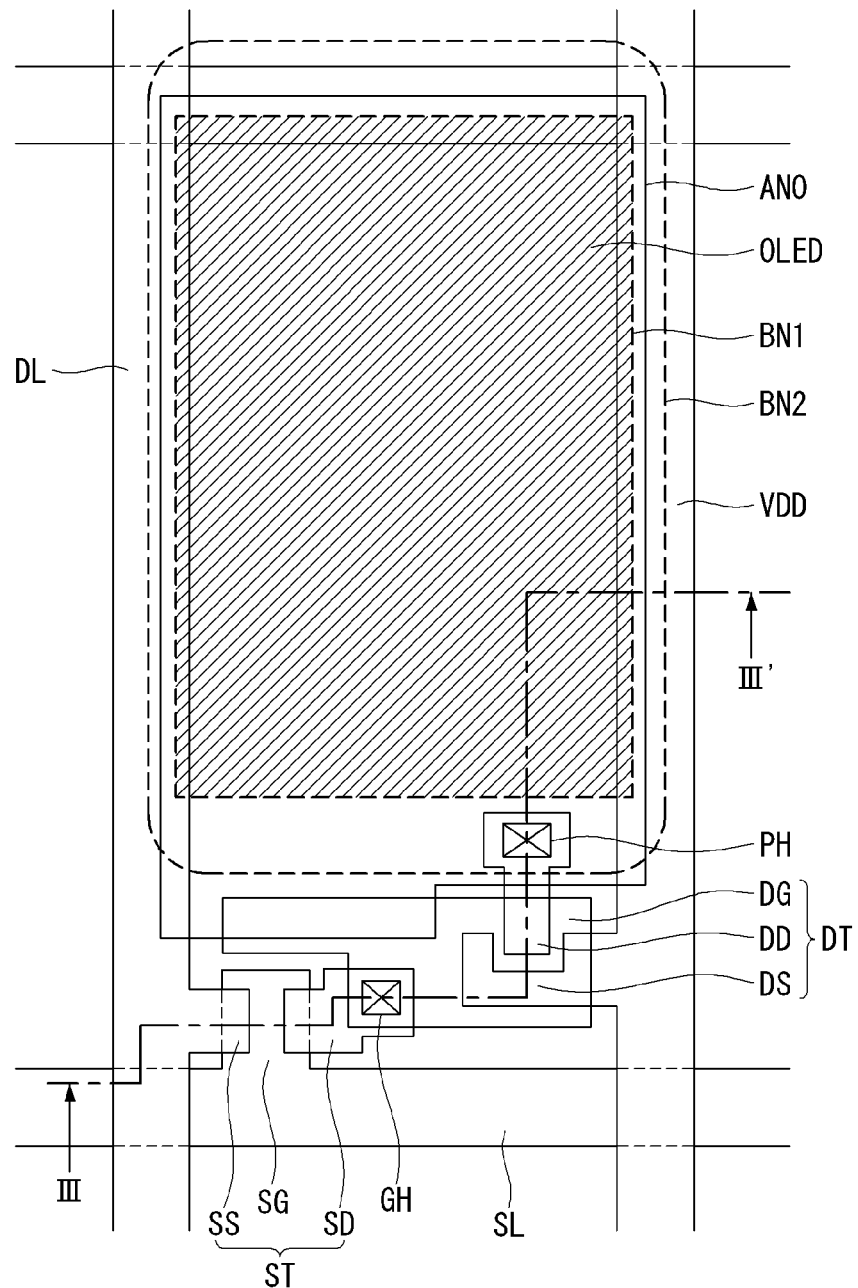
FIG. 8 is a plane view illustrating an organic light emitting diode display having a double bank structure according to a second example embodiment of the present disclosure.
Figure 9:
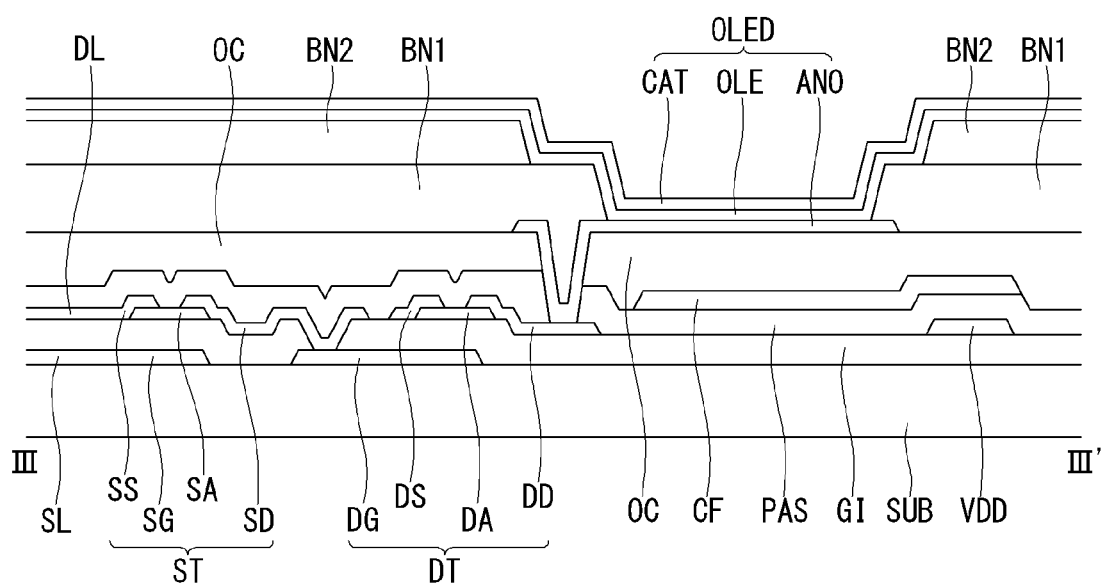
FIG. 9 is a cross sectional view along line of III-III' in FIG. 8 for illustrating the structure of an organic light emitting diode display according to the second embodiment of the present disclosure.

Hereinafter, with reference to FIGS. 8 and 9, we will explain about the second embodiment of the present disclosure. FIG. 8 is a plane view illustrating an organic light emitting diode display having a double bank structure according to the second embodiment of the present disclosure. FIG. 9 is a cross sectional view along the cutting line of III-III' in FIG. 8 for illustrating the structure of an organic light emitting diode display according to the second embodiment of the present disclosure.

With reference to FIGS. 8 and 9, an organic light emitting diode display according to the second embodiment of the present disclosure has a switching thin film transistor ST, a driving thin film transistor DT connected to the switching thin film transistor ST, and an organic light emitting diode OLED connected to the driving thin film transistor DT.

The switching thin film transistor ST is formed where the scan line SL and the data line DL is crossing. The switching thin film transistor ST can select any specific pixel. The switching thin film transistor ST includes a gate electrode SG branching from the scan line SL, an active layer SA, a source electrode SS and a drain electrode SD.

The driving thin film transistor DT can drive the organic light emitting diode OLED of a pixel selected by the switching thin film transistor ST. The driving thin film transistor DT includes a gate electrode DG connected to the drain electrode SD of the switching thin film transistor ST, an active layer DA, a source electrode DS connected to the driving current line VDD, and a drain electrode DD. The drain electrode DD of the driving thin film transistor DT is connected to the anode electrode ANO of the organic light emitting diode OLED.

On the substrate SUB of the active matrix organic light emitting diode display, the gate electrodes SG and DG of the switching thin film transistor ST and the driving thin film transistor DT, respectively, formed on a substrate SUB. On the gate electrodes SG and DG, the gate insulator GI is deposited. The semiconductor layers SA and DA are formed on some portions of the gate insulator GI overlapping with the gate electrodes SG and DG. On the semiconductor layers SA and DA, the source electrodes SS and DS and the drain electrodes SD and DD are facing each other respectively with certain distance. The drain electrode SD of the switching thin film transistor ST is connected to the gate electrode DG of the driving thin film transistor DT via the contact hole penetrating the gate insulator GI.

The passivation layer PAS is deposited on the substrate SUB having the switching thin film transistor ST and the driving thin film transistor DT. On the passivation layer PAS, a color filter CF covering whole emitting area defined in the pixel area is formed. The organic light emitting diode display according to the second embodiment of the present disclosure is applied to the bottom emission type, so that the color filter CF is formed under the organic light emitting diode OLED. On the whole surface of the substrate SUB having the color filter CF, an over coat layer OC is deposited. Here, the anode electrode ANO is connected to the drain electrode DD of the driving thin film transistor DT through the pixel contact hole PH formed at the passivation layer PAS and the over coat layer OC.

To define an emitting area on the substrate SUB having the anode electrode ANO, a first bank BN1 is formed for dividing a non-emitting area having the switching thin film transistor ST, the driving thin film transistor DT and the various lines DL, SL and VDD from the emitting area having the organic light emitting diode OLED. On the first bank BN1, a second bank BN2 is formed.

The first bank BN1 includes an open area defining an actual emitting area. The second bank BN2 covers some portions of the upper surface of the first bank BN1, and has an open area having a larger area than that of the open area by the first bank BN1. That is, there is a step profile between the first bank BN1 and the second bank BN2.

By the first bank BN1 and the second bank BN2, most portions of the anode electrode ANO are exposed. On the anode electrode ANO exposed from the first bank BN1 and the second bank BN2, an organic light emitting layer OLE and a cathode electrode CAT are sequentially deposited. As the second embodiment of the present disclosure relates to the bottom emission type organic light emitting diode display, one color filter CF representing any one color among the red, green and blue colors is formed under the organic light emitting diode OLED. In this case, the organic light emitting layer OLE may include the organic light emitting material radiating the white light.

Considering the easiness of the manufacturing process and the production yield, it is preferable that the organic material emitting the white light is deposited on the whole surface of the substrate SUB having the first and the second banks BN1 and BN2. Then, on the whole surface of the substrate SUB having the organic light emitting layer OLE, the cathode electrode CAT is deposited. Then, the organic light emitting diode OLED connecting to the driving thin film transistor DT and including the anode electrode ANO, the organic light emitting layer OLE and the cathode electrode CAT is completed.

In the second embodiment, the organic light emitting layer OLE is deposited on the whole surface of the substrate SUB having the first bank BN1 and the second bank BN2. Especially, the organic light emitting layer OLE covers the upper surface of the second bank BN2, the side wall of the second bank BN2, the upper surface of the first bank BN1 exposed by the open area of the second bank BN2, the side wall of the first bank BN1, and the upper surface of the anode electrode ANO exposed by the open area of the first bank BN1. As the organic light emitting layer OLE is deposited as covering the border area having the stepped profile between the first bank BN1 and the second bank BN2, at least within the open area by the first bank BN1, the organic light emitting layer OLE can be deposited without any 'non-fill area'. Therefore, according to the second embodiment of the present disclosure, the emitting area defined by the first bank BN1 can be completed without any loss of the aperture ratio. In other words, the aperture area (or open area) defined by the first bank BN1 can be just defined as the emitting area.

Further, as explained in the second embodiment, in the case that the over coat layer OC is deposited after forming the thin film transistors ST and DT, the surface roughness of the substrate SUB is getting more even, and the electrical interference between the line SL, DL or/and VDD and the anode electrode ANO can be reduced. Therefore, it is possible to design as the anode electrode ANO being overlapped with the lines SL, DL and/or VDD. As a result, it is possible to define more enlarged open area and emitting area and to get an organic light emitting diode display having the higher aperture ratio.

In the above first and second embodiments, the shape of the second bank BN2 has the larger open area than that of the first bank BN1 in each pixel area. In other case, it is possible to form the second bank BN2 includes two or more first banks BN1.

Figure 10:
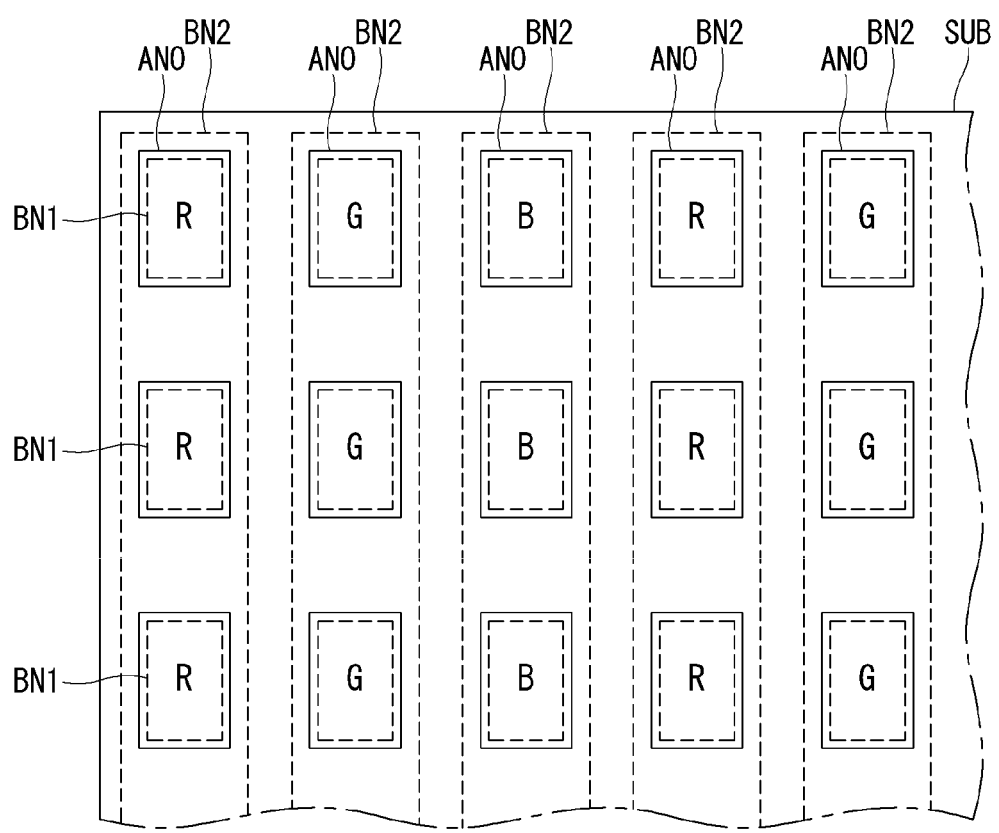
FIG. 10 is a plane view illustrating the structure of the organic light emitting diode display in which the second bank is formed as including a plurality of the first banks formed at the pixel areas representing the same color light according to the second embodiment of the present disclosure.

For example, in the first embodiment in which each pixel area has any one color organic light emitting layer OLE among the red, green and blue lights, the second bank BN2 may be formed as that its opening area includes a plurality of the first banks BN1 formed at the pixel areas having the same color organic light emitting layer OLE. FIG. 10 is a plane view illustrating the structure of the organic light emitting diode display in which the second bank is formed as including a plurality of the first banks formed at the pixel areas representing the same color light according to the second embodiment of the present disclosure.

On the substrate SUB, a plurality of the anode electrodes ANO is arrayed in a matrix manner. A plurality of the first banks BN1 is formed as that each of the first bank BN1 is exposing the most upper surface of the each anode electrode ANO. Actually, the drawing number BN1 means the border line of the open area exposed by the first bank BN1. In the figures, it is represented as the first bank BN1 itself, in convenient.

In the case that the unit color pixels of red, green and blue are alternatively arrayed along the horizontal line on the substrate SUB, as shown in FIG. 10, one pixel column along the vertical line has a plurality of pixels allocating the same color. Therefore, the second bank BN2 may be formed as including all open area defined by all first banks BN1 of all pixels along the vertical line, i.e., any one column.

Then, depositing the red organic light emitting material and patterning it as the red organic light emitting material is remained in the columns of (3N-2) (here, N is natural number), the red columns can be formed. By the same method, the green columns can be formed as being filled within the columns of (3N-1) (N is natural number). Also, the blue columns can be formed as being filled within the columns of 3N (N is natural number).

For example, the second bank BN2 has the first group open area exposing all of the anode electrodes ANO disposed in each $(3N-2)^{th}$ column allocated as the red pixel column. Also, the second bank BN2 has the second group open area exposing all of the anode electrodes ANO disposed in each $(3N-1)^{th}$ column allocated as the green pixel column. Further, the second bank BN2 has the third group open area exposing all of the anode electrodes ANO disposed in each $(3N)^{th}$ column allocated as the blue pixel column.

Each of red, green and blue organic light emitting material filled within the each open areas defined by the second bank BN2. Especially, the organic light emitting material can fill the whole area of the open area defined by the first bank BN1 without any non-fill area. As the result, the open area defined by the first bank BN1 can be just defined as the actual emitting area without loss of aperture ratio.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic light emitting diode display, comprising:
   a substrate having a plurality of pixel area arrayed in a matrix manner;
   an anode electrode formed within the pixel area on the substrate;
   a first bank having an open area exposing most of the anode electrode and defining an emission area;
   a second bank having a second open area exposing a plurality of the first open areas exposed by the first bank and some upper surface of the first bank by completely surrounding the plurality of the first open areas;
   an organic light emitting layer covering the some upper surface of the first bank by the second bank and the most of anode electrode exposed by the first bank; and
   a cathode electrode formed over the substrate having the organic light emitting layer,
   wherein the second open area exposes a plurality of the anode electrodes disposed at neighboring pixel areas allocated with the same color lights.

2. The device according to the claim 1, further comprising:
   a thin film transistor disposed within the pixel area and connected to the anode electrode.

3. The device according to the claim 1, further comprising:
   a color filter disposed under the anode electrode and representing any one of red, green and blue allocated in each pixel,
   wherein the organic light emitting layer includes an organic material emitting a white light.

4. The device according to the claim 1, wherein the organic light emitting layer includes an organic material emitting any one of red, green and blue color lights allocated at each pixel area.

5. The device according to the claim 1, wherein the second open area includes:
   a first color open area exposing all of the anode electrodes allocated to neighboring red pixel areas;
   a second color open area exposing all of the anode electrode allocated to neighboring green pixel areas; and
   a third color open area exposing all of the anode electrodes allocated neighboring blue pixel areas.

6. An organic light emitting diode display, comprising:
   a substrate having a plurality of pixel areas arranged in a matrix array thereon;
   a plurality of anode electrodes within respective ones of the pixel areas;
   a first bank having first open areas exposing respective ones of the anode electrodes and defining an emission area;
   a second bank having a second open area exposing a plurality of the first open areas and a portion of an upper surface of the first bank by completely surrounding the plurality of the first open area;
   a plurality of organic light emitting layers each on the exposed portion of the upper surface of the first bank and on a respective anode electrode; and
   a cathode electrode over the plurality of organic light emitting layer,
   wherein the second open area exposes a plurality of the anode electrodes disposed at neighboring pixel areas of a same color of light.

* * * * *